United States Patent
Lukaszewski et al.

(10) Patent No.: US 6,260,046 B1
(45) Date of Patent: Jul. 10, 2001

(54) PRODUCT ARCHITECTURE RETRIEVAL INFORMATION SYSTEM

(75) Inventors: Matthew S. Lukaszewski, Monroe; Flavio M. Manduley, Woodbury, both of CT (US)

(73) Assignee: Pitney Bowes Inc., Stamford, CT (US)

( * ) Notice: Subject to any disclaimer, the term of this patent is extended or adjusted under 35 U.S.C. 154(b) by 0 days.

(21) Appl. No.: 09/203,878

(22) Filed: Dec. 2, 1998

(51) Int. Cl.[7] .................................................. G06F 17/30
(52) U.S. Cl. ............................................ 707/103; 707/104
(58) Field of Search ............................. 345/331; 700/97; 703/1; 705/16; 706/101; 707/103, 104

(56) References Cited

U.S. PATENT DOCUMENTS

| | | | |
|---|---|---|---|
| 4,553,206 | * 11/1985 | Smutek et al. | 707/101 |
| 5,555,406 | * 9/1996 | Nozawa | 703/1 |
| 5,727,159 | 3/1998 | Kikinis | 709/246 |
| 5,752,027 | 5/1998 | Familiar | 707/103 |
| 5,754,737 | 5/1998 | Gipson | 706/11 |
| 5,765,142 | 6/1998 | Allred et al. | 705/26 |
| 5,767,848 | * 6/1998 | Mazsuzaki et al. | 345/331 |
| 5,767,854 | 6/1998 | Anwar | 345/355 |
| 5,782,466 | 7/1998 | Regimbal et al. | 270/58.08 |
| 5,838,965 | * 11/1998 | Kavanagh et al. | 707/103 |
| 5,880,959 | * 3/1999 | Shal et al. | 700/97 |

* cited by examiner

*Primary Examiner*—Thomas Black
*Assistant Examiner*—Walter Benson
(74) *Attorney, Agent, or Firm*—Ronald Reichman; Michael E. Melton (57) ABSTRACT

This invention is a system and method that enables inexperienced or new engineers or engineers that do not have a complete knowledge of the available knowledge to automatically use the experience and designs that have previously been used by experienced engineers in the organization. The engineering user of this system is able to identify requirements, components (product building blocks), documentation, processes, test, historical data, etc., as options for re-use. This is accomplished by parsing the required information automatically from product and component specifications. The "Architecture Wizard" provides the ability to graphically specify architectures from scratch and/or by using existing architectures (components and their associated attributes).

26 Claims, 6 Drawing Sheets

FIG. 2A
(PARIS FUNCTIONAL BLOCK DIAGRAM)

FIG. 2D
(PARIS ATTRIBUTE DISPLAY)

FIG. 3 (ARCHITECTURE WIZARD)

PRODUCT ARCHITECTURE RETRIEVAL INFORMATION SYSTEM

CROSS REFERENCE TO RELATED APPLICATIONS

Reference is made to application Ser. No. 09/204,127, entitled A METHOD AND SYSTEM FOR CREATING A RULES-BASED DOCUMENT, assigned to the assignee of this application and filed on even date herewith.

FIELD OF THE INVENTION

This invention relates generally to the field of computer systems and more particularly to the field of computer aided engineering design and decision systems.

BACKGROUND OF THE INVENTION

Engineering is the art of directing the great sources of power in nature for the use and convenience of humans. The process by which these goals are achieved is engineering design. Engineering design commences upon the recognition of the need to satisfy some human want or desire, which might range from the detection and destruction of incoming aircraft to the design of some type of fastener, i.e., a special type of screw.

The first obligation of the engineer is to develop more detailed, quantitative information which defines the human want or task to be accomplished in order to formulate the task as a specification. At this point, the scope of the problem is defined and the need for pertinent information is established. In many engineering situations, particularly those where there is a great body of experience residing in a company that has previously designed similar products, models or systems, a large amount of this experience or expertise is unable to be found or is lost. Consequently, many existing components are needlessly redesigned or modified, even when no change is required.

The forgoing problem is exacerbated when inexperienced or new engineers are assigned to design the product, model or system. This often causes additional time and expense to design the product. Oftentimes, the product does not function as well as was expected. Furthermore, some apparently inconsequential design changes to components of systems will greatly affect other components of the system. Engineering design changes may also affect: the cost and difficulty of manufacturing the product; the ability to sell the product; the ability to service the project and the reliability of the product.

SUMMARY OF THE INVENTION

This invention overcomes the disadvantages of the prior art by providing a system and method that enables inexperienced or new engineers or engineers that do not have a complete knowledge of the available knowledge to automatically use the experience and designs that have previously been used by experienced engineers in the organization. The engineering user of this system is able to identify requirements, components (product building blocks), documentation, processes, test, historical data, etc., as candidates for reuse. This is accomplished by parsing the required information automatically from product and component specifications.

The foregoing lowers the development cost of components, while improving the quality of the product. The time required to design the product is also reduced. Consequently, new products may be brought to market faster. In addition, an "Architecture Wizard" provides the ability to graphically specify architectures from scratch and/or use existing architectures (components and their associated attributes).

DETAILED DESCRIPTION OF THE PREFERRED EMBODIMENT

Figure 1:
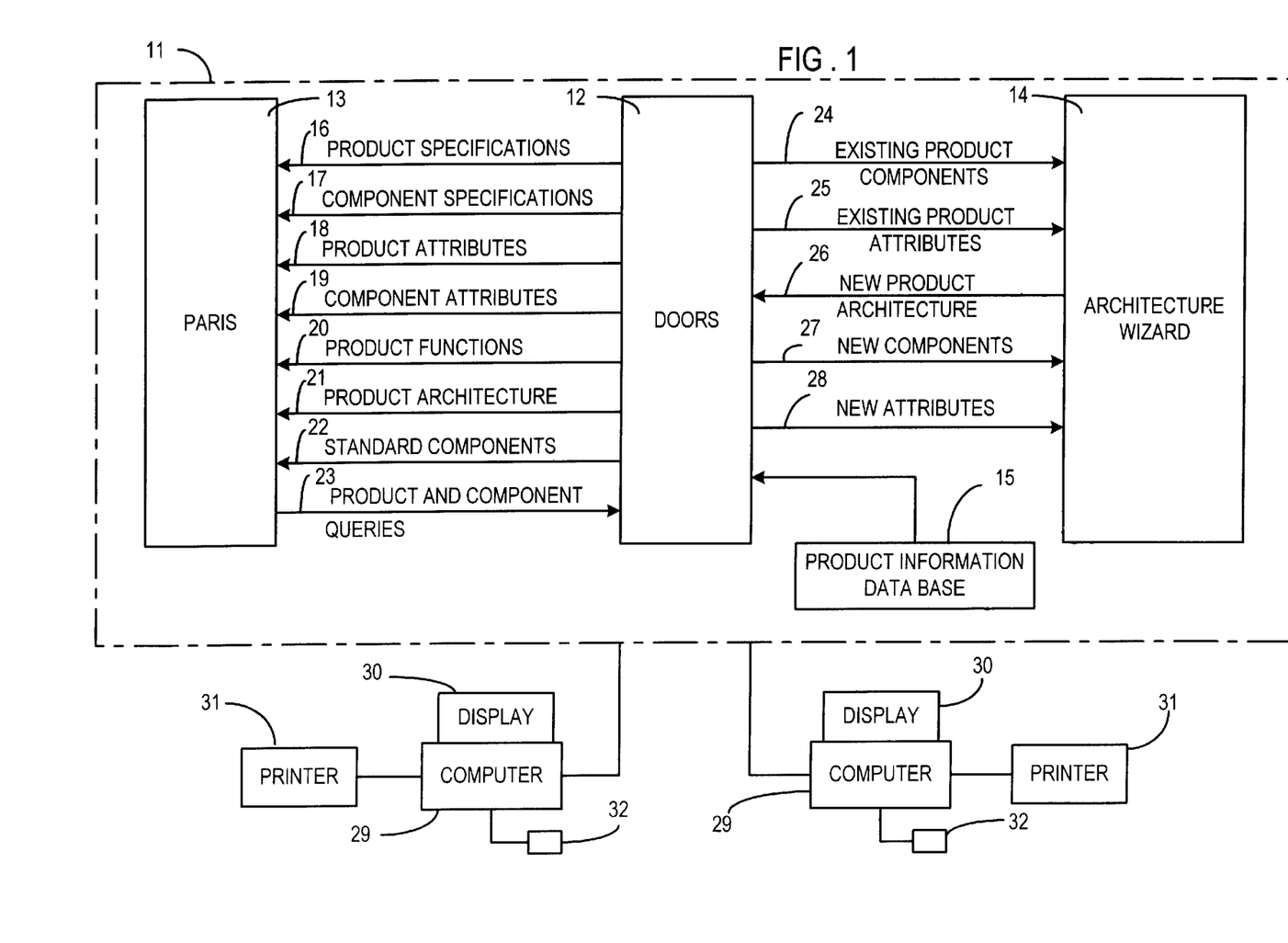
FIG. 1 is a block diagram of the system of this invention.

Referring now to the drawings in detail, and more particularly to FIG. 1, the reference character 11 represents a server. Server 11 contains: DOORS Software 12; Product Architecture Retrieval Information Software (PARIS) 13; Architecture Wizard Software 14; and Product Information Data Base 15. Product Specifications are transmitted from software 12 to software 13 via communications path 16 and component specifications are transmitted from software 12 to software 13 via communications path 17. Product attributes data is transmitted from software 12 to software 13 via communications path 18 and component attributes data is transmitted from software 12 to software 13 via communications path 19. Product functions data is transmitted from software 12 to software 13 via communications path 20 and product architecture data is transmitted from software 12 to software 13 via communications path 21. Standard components data is transmitted from software 12 to software 13 via communications path 22, and product and component queries are transmitted from software 13 to software 12 via communications path 23. Existing product components data is transmitted from software 12 to software 14 via communications path 24 and existing product attributes data is transmitted from software 14 to software 12 via communications path 25. New Product architecture data is transmitted from software 12 to software 14 via communications path 26 and new components data is transmitted from software 12 to software 14 via communications path 27. New attributes data is transmitted from software 12 to software 14 via communications path 28. A plurality of computers 29 having displays 30, printers 31 and input output devices 32 are coupled to server 11.

DOORS Software 12 provides a secure, controlled environment for information management. Software 12 establishes relationships between parts of project documentation and permits teams working at multiple locations to use the same database concurrently. Software 12 is manufactured by Quality Systems & Software Ltd. of 200 Valley Road, Suite 306, Mt. Arlington, N.J. 07856. Software 13 controls the display of the existing building blocks of the product components in graphical form or textual form on displays 32. Software 13 is described in the description of FIGS. 2A–2C. Architecture wizard software 14 specifies the product component architecture using software 13 based building blocks. Software 14 is described in the description of FIG. 4. Product information database 15 contains information about product components that is not contained within software 12.

Figure 2A:
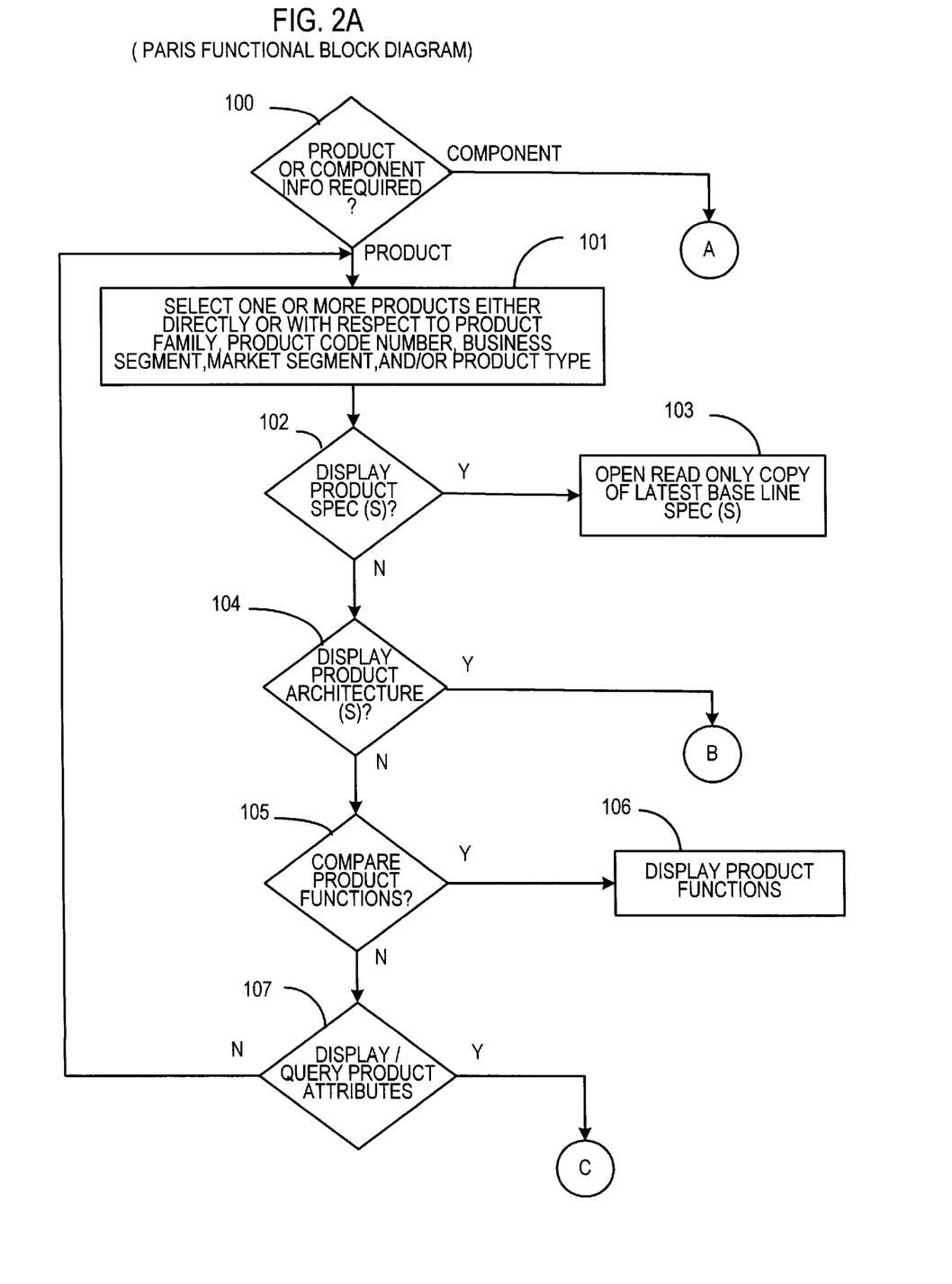
FIGS. 2A–2D is a flow chart showing the Product Architecture Retrieval Information Software 12.
Figure 2B:
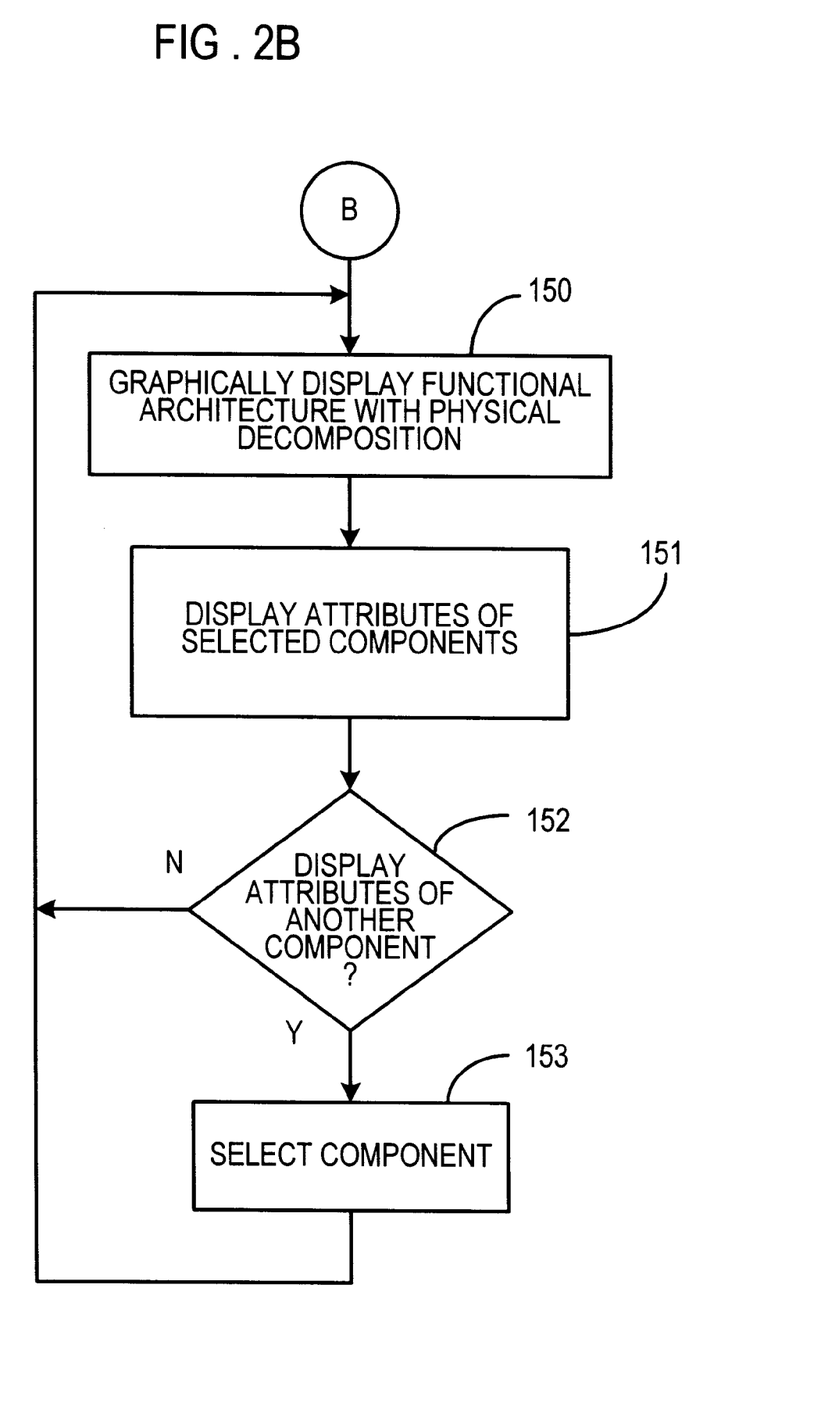
Figure 2C:
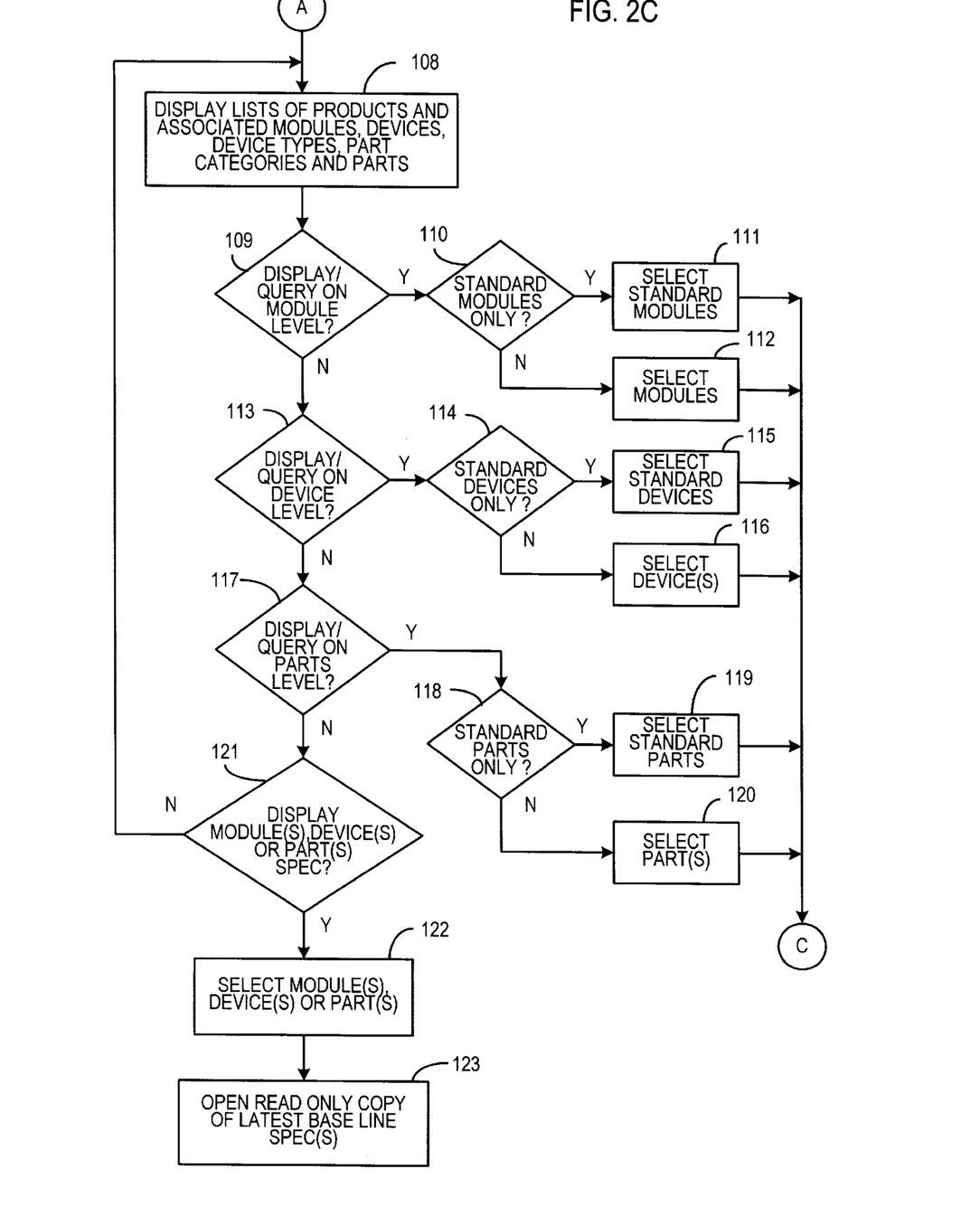
Figure 2D:
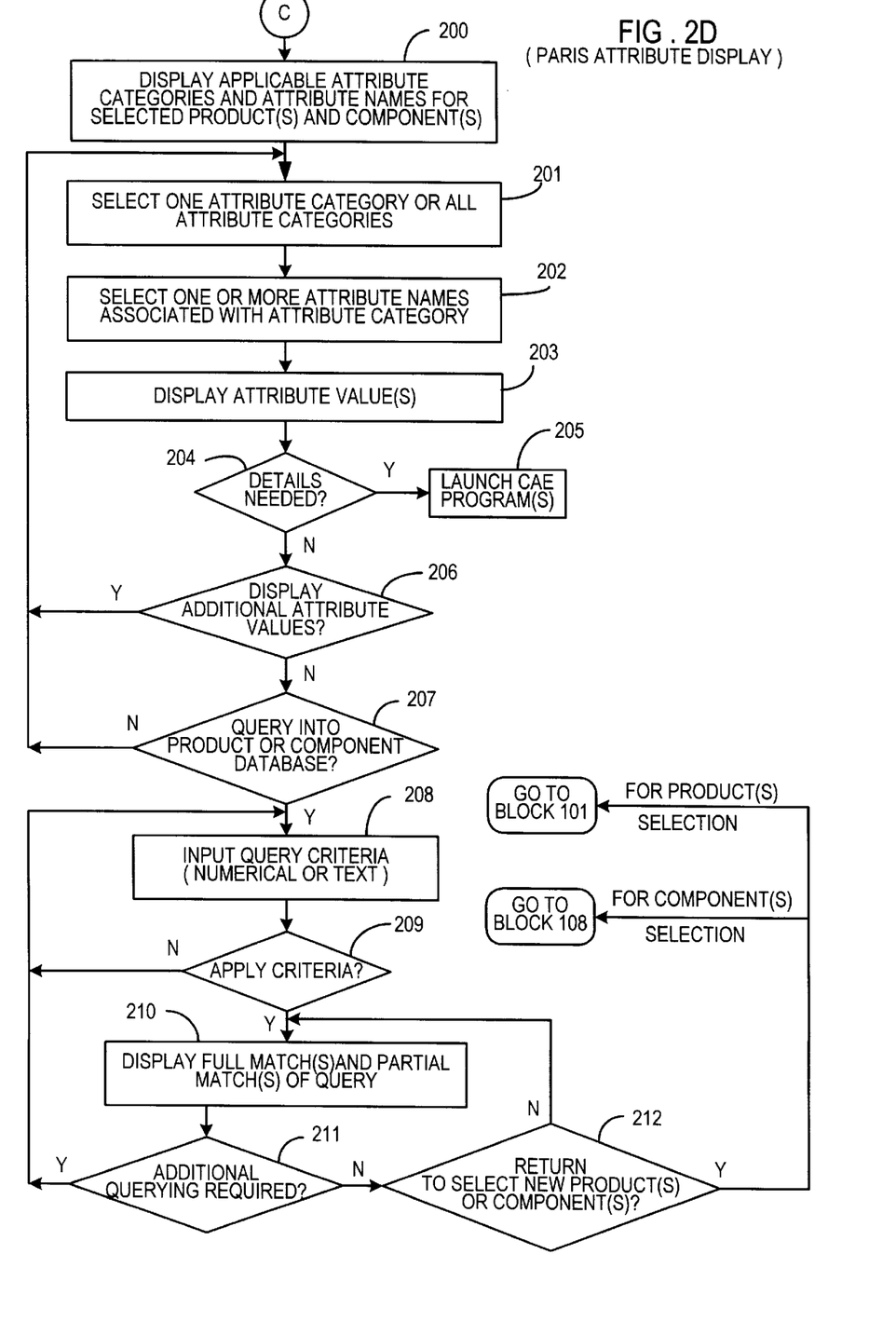

FIGS. 2A–2C is a flow chart showing the Product Architecture Retrieval Information Software 12. This program begins in decision block 100 of FIG. 2A. Block 100 determines whether the user of computer 29 requested product or component information. If the user of computer 29 requested component information, the program will proceed to block 108 of FIG. 2B. If block 100 determines that a user of computer 29 requested product information, then the program will go to block 101. Block 101 will select one or more products, either directly or with respect to the product family, product code number, business segment, market segment, and/or product type. After making one of the above selections, the program will go to decision to block 102. Decision block 102 will determine whether or not to display the product specification(s) on a display 30. If Block 102 determines to display the product specification(s), then the program goes to block 103 to open the read-only copy of the latest base line specification(s). If Block 102 determines not to display the product specification(s), then the program goes to decision block 104.

Decision Block 104 determines whether or not to display the product architecture(s). If Block 104 determines to display the product architecture(s), then the program goes to block 150. Block 150 graphically displays the functional architecture with physical decomposition. Then the program goes to block 151 to display the attributes of the selected component. Now the program goes to decision to block 152. Block 152 determines whether one not to display the attributes of another component. If Block 152 determines not to display the attributes of another component, then the program goes back to the input of block 150. If Block 152 decides to display the attribute of another component, then the program goes to block 153 to select the component. At this point, the program will go back to the input of block 150.

If Block 104 determines not to display the product architecture(s), then the program goes to decision block 105. Decision block 105 compares the product functions. If the product functions are the same, the program goes to block 106 to display the product functions. If the product functions are not the same, the program goes to decision block 107. Decision block 107 determines whether or not to display the query product attributes. If block 107 determines not to display the query product attributes, then the program goes back to block 101. If block 107 determines to display the query product attributes, then the program goes to block 200 (FIG. 2C).

In FIG. 2B, block component display 108 receives an input from decision block 100. Block 108 displays the lists of products and associated modules, devices, device types, part categories and parts. Now the program goes to decision block 109. Block 109 determines whether or not to display the query on a module will level. If block 109 determines to display the query on a module level, then the program goes to decision block 110. Decision block 110 determines whether or not to only display the standard module. If Block 110 determines to display the standard module, then the program goes to block 111 to select the standard modules. At this point, the program will go to block 200 (See FIG. 2C). If Block 110 determines not to display the standard module, then the program goes to block 112 to select the selected modules. At this point, the program will go to block 200 (FIG. 2C).

If block 109 determines not to display or query on a module level, then the program goes to decision block 113. Decision block 113 determines whether or not to display or query on a device level. If Block 113 determines to display or query on a device level, then the program goes to decision block 114. If block 114 determines only to display the standard device, then the program goes to block 115 to select the standard devices. At this point, the program will go to block 200 (FIG. 2C). If Block 114 determines not to display the selected device(s), then the program goes to block 116 to select the selected device(s). At this point, the program will go to block 200 (FIG. 2C). If Block 113 determines not to display or query on a device level, the program goes to decision block 117.

Decision block 117 determines whether or not to display or query on a parts level. If Block 117 determines to display or query on a parts level, then the program goes to decision block 118. If block 114 determines only to display the standard parts, then the program goes to block 119 to select the standard parts. At this point, the program will go to block 200 (FIG. 2C). If Block 118 determines not to display the standard part(s), then the program goes to block 120 to select the selected parts(s). At this point, the program will go to block 200 (FIG. 2C). If Block 117 determines not to display or query on parts, the program goes to decision block 121.

Decision block 121 determines whether or not to display the module(s), device(s) or part(s) specification. If Block 121 determines not to display the module(s), device(s) or part(s) specifications, the program goes back to the input of block 108. If Block 121 determines to display the module(s), device(s) or part(s) specifications, the program goes to block 122 to select the module(s), device(s) or part(s). Now the program goes to block 1243 to open the read-only copy of the latest base line specification(s).

In FIG. 2C block 200 receives an input from decision block 107. Block 107 displays the applicable attribute categories and attribute names for selected product(s) or selected component(s). Now the program goes to block 101 to select one attribute category or all attributes categories. Then the program goes to block 202 to select one or more attribute names associated with the attribute category. Then the program goes to block to 203 to display the attribute value(s). Then the program goes to decision block 204. Decision block 204 determines whether or not details are needed. If decision block 204 determines that details are needed, then the program goes to block 205 to launch the applicable Computer Aided Engineering (CAE) programs. CAE programs are programs that contain additional design details, i.e., additional electrical, electronic, mechanical or electromechanical details.

If decision block 204 determines that details are not needed, then the program goes to decision block 206. Block 206 determines whether or not to display additional attribute values. If block 206 determines to display additional attribute values, then the program goes back to the input of block 201. If block 206 determines not to display additional attribute values, then the program goes to decision block 207. Block 207 determines whether or not to query into the product or component data base. If block 207 determines not to query into the product or component data base, then the program goes back to the input of block 201. If block 206 determines to query into the product or component data base, then the program goes to block 208 to input the queried numerical or textual criteria.

Now the program goes to decision block 209. Decision block 209 determines whether or not to apply the criteria. If block 209 determines not to apply the criteria, then the program goes back to the input of block 208. If block 209 determines to apply the criteria, then the program goes to block 210 to display all match(es) and partial match(es) of the query. Then the program goes to decision block 211. Block 211 determines whether or not additional queries are required. If additional queries are required, then the program goes back to the input of block to 208. If additional queries are not required, then the program goes back to the input of block 210.

Figure 3:
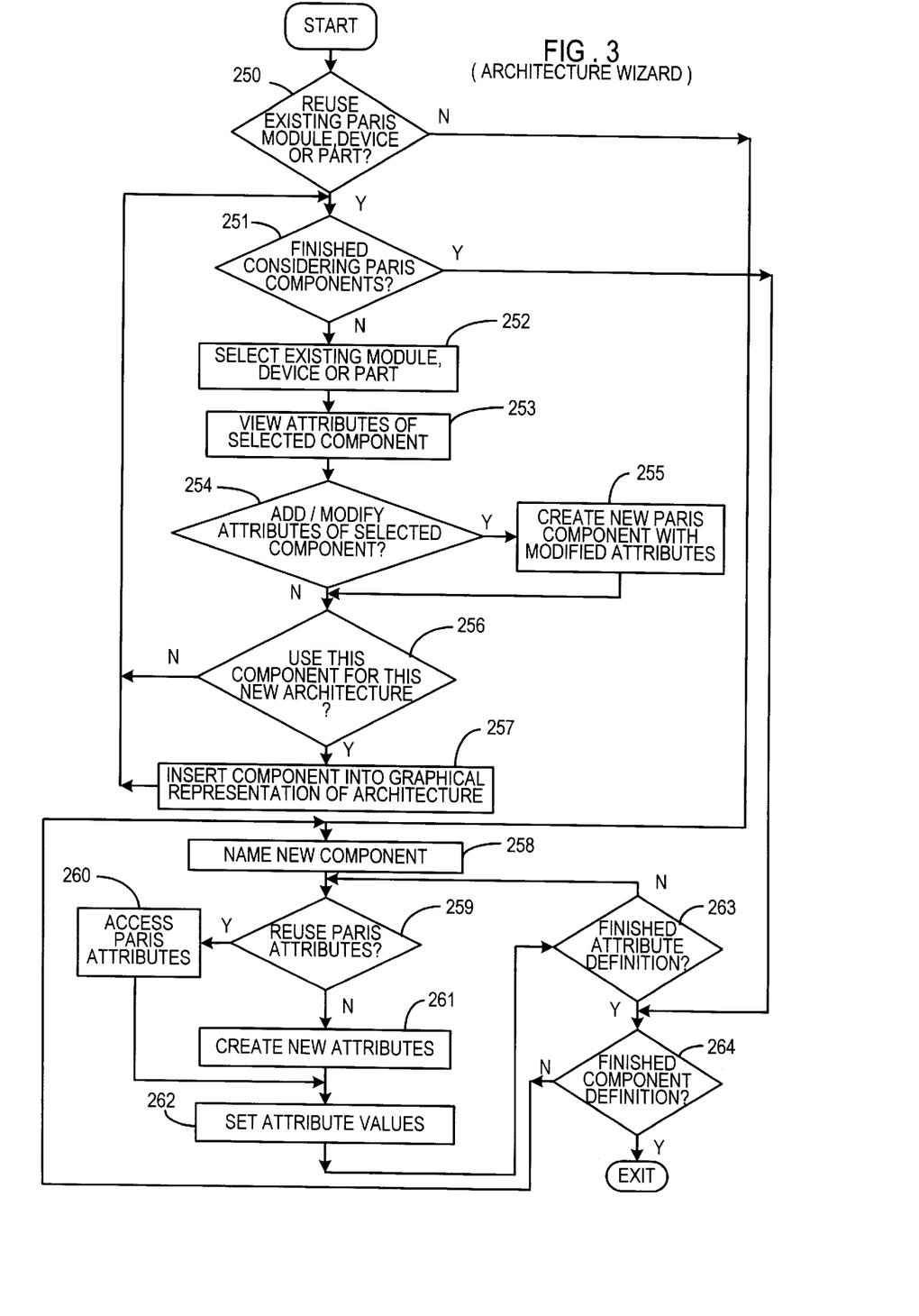
FIG. 3 is a flow chart showing the Architecture Wizard Software 14.

FIG. 3 is a flow chart showing the Architecture Wizard Software 14. The program begins at start and then goes to decision block 250. Decision block 250 determines whether or not to revise the existing Product Architecture Retrieval Information Software (PARIS) 13 modules, devices or parts. If block 250 determines not to revise the existing modules, devices or parts, the program goes to block 258. If block 250 determines to revise the existing modules, devices or parts, the program goes to decision block 251. Block 251 determines whether or not software 14 finished analyzing all software 13 components. If block 251 determines that all the software 13 components have been analyzed, the program goes to block 264. If block 251 determines that all the software 13 components have not been analyzed, the program goes to block 252 to select the existing module(s), device(s) or part(s). Now the program goes to block 253 to view the attributes of the selected component.

At this point, the program goes to decision block 254. Block 254 determines whether or not to add or modify the attributes of the selected component. If block 254 determines that the attributes of the selected component should be modified, the program goes to block 255 to create a new software 13 component with modified attributes. Then the program goes to the input of decision block 256. If block 254 determines that the attributes of the selected component should not be modified, the program goes to decision block 256. Block 256 determines whether or not to use the selected component for this new architecture. If block 256 determines not to use the selected component for the new architecture, the program goes back to the input of block 251. If block 256 determines to use the selected component for the new architecture, the program goes block 257 to insert the component into the graphical representation of the architecture which will be displayed on displays 29 and which may be printed on printers 31. Then the program goes back to the input of block 251.

If block 250 decides not to re-use the existing PARIS modules, devices or parts. Block 258 names the new component. Then the program goes to decision block 259. Block 259 determines whether or not to re-use software 13 attributes. If block 259 determines to re-use software 13 attributes, the program goes to block 260 to access software 13 attributes. At this point the program goes to block 262. If block 259 determines not to reuse software 13 attributes, the program goes to block 261 to create new software 13 attributes. Then the program goes to block 262 to set attribute values. Now the program goes to decision block 263. Block 263 determines whether or not the attribute definition has been finished. If the attribute definition has not been finished, the program goes back to the input of block 259. If the attribute definition has been finished, the program goes to decision block 264. Decision block 264 is also entered from a positive response of decision block 251. Block 264 determines whether or not the component definition has been finished. If the component definition has not been finished, the program goes back to the input of block 258. If the component definition has been finished, the program exits.

The above specification describes a new and improved system and method that helps engineers design different systems and equipment. It is realized that the above description may indicate to those skilled in the art additional ways in which the principles of this invention may be used without departing from the spirit. It is, therefore, intended that this invention be limited only by the scope of the appended claims.

What is claimed is:

1. A computer system for accessing information about modules, devices and device types of one or more products that function in certain specified ways, said system comprising:

means for obtaining information regarding functions of modules, devices, or device types of one or more of the products;

means for obtaining information regarding functional architecture of modules, devices and device types of one or more of the products;

means for identified criteria for module, device or device type selection;

means for using the identification criteria, the function information and the functional architecture information of modules, devices or device types to determine whether or not the functional information and the functional architecture information of the modules, devices or device types matches the identified criteria; and displaying those modules, devices and device types that match the identified criteria and may be used in the selection of the module, device or device type to be incorporated in the product.

2. The system claimed in claim 1, further including:
   means for determining whether or not the component is a candidate for reuse.

3. The system claimed in claim 1, further including:
   means for determining whether or not the component is a candidate for inclusion in the design of the product .

4. The system claimed in claim 1, further including:
   means for determining whether or not the component is a candidate for reuse in a new design of the product.

5. The system claimed in claim 1, further including:
   means for determining whether or not the component is a candidate for reuse in a existing design.

6. The system claimed in claim 1, further including:
   means for obtaining information regarding characteristics of modules, devices and device types of the products that function in certain specified ways.

7. The system claimed in claim 1, further including:
   means for determining which modules, devices, or device types partially match the identified criteria displaying the modules, devices, and device types that partially match the identified criteria.

8. The system claimed in claim 1, further including means for displaying the modules, devices, and device types that partially match the identified criteria.

9. The system claimed in claim 1, further including means for specifying architecture of a new design.

10. The system claimed in claim 1, further including means for changing the functional architecture of an existing design.

11. A method for creating and maintaining information about module data bases, device data bases and device type data bases of a product by a user in a word processed document, the method performed in a word processing system including a programmed computer, a display device and an input device, the method comprising the steps of:

determining actual values of module attributes, device attributes and device type attributes of products;

extracting module attributes, device attributes and device type attributes from controlled and secured word processed documents;

placing the extracted attribute values into data bases;

establishing relationships among modules, devices and device types of products in the data bases;

displaying the relationships of the product modules, devices and device types; and displaying attributes about the modules, devices and device types of the products contained in the data bases so that one or more of the modules, devices and device types may be used in the design of the products by selecting the attribute values of the modules, devices, and device types that match the needed attribute values of the module, device, or device type.

12. The method of claim 11, further including the step of:

permitting users working at multiple locations to access component attributes concurrently.

13. The method of claim 11, further including the step of:

permitting users working at multiple locations to access component attributes and relationships of component attributes concurrently.

14. The method claimed in claim 11, wherein the component relationships are displayed in graphical form.

15. The method claimed in claim 11, wherein the component relationships are displayed in textual form.

16. The method claimed in claim 11, wherein in the extracting step product specifications are supplied.

17. The method claimed in claim 11, wherein in the extracting step component specifications are supplied.

18. The method claimed in claim 11, wherein in the extracting step product attributes are supplied.

19. The method claimed in claim 11, wherein in the extracting step product functions are supplied.

20. The method claimed in claim 11, wherein in the extracting step component attributes are supplied.

21. The method claimed in claim 11, wherein in the extracting step product architectures are supplied.

22. The method claimed in claim 11, further including the step of identifying components that will be standard components for reuse.

23. The method claimed in claim 22, further including the step of:

displaying the standard components.

24. The method claimed in claim 22, further including the step of:

identifying components that partially satisfy requirements for re-use of the component.

25. The method claimed in claim 11, wherein the attributes are defined with the same nomenclature.

26. The method claimed in claim 11, further including the step of:

obtaining additional information about the components through linkages to software application programs.

* * * * *